United States Patent
Qi

(10) Patent No.: US 10,746,524 B2
(45) Date of Patent: Aug. 18, 2020

(54) FILM THICKNESS DETECTION DEVICE

(71) Applicant: WEIHAI HUALING OPTO-ELECTRONICS CO., LTD., Shandong (CN)

(72) Inventor: Wuchang Qi, Shandong (CN)

(73) Assignee: WEIHAI HAULING OPTO-ELECTRONICS CO., LTD., Weihai, Shandong (CN)

(*) Notice: Subject to any disclaimer, the term of this patent is extended or adjusted under 35 U.S.C. 154(b) by 17 days.

(21) Appl. No.: 16/099,443

(22) PCT Filed: Sep. 23, 2016

(86) PCT No.: PCT/CN2016/099938
§ 371 (c)(1),
(2) Date: Nov. 7, 2018

(87) PCT Pub. No.: WO2017/201932
PCT Pub. Date: Nov. 30, 2017

(65) Prior Publication Data
US 2019/0145751 A1  May 16, 2019

(30) Foreign Application Priority Data
May 26, 2016 (CN) .......................... 2016 1 0366988

(51) Int. Cl.
G01R 27/08 (2006.01)
G01B 7/06 (2006.01)
(Continued)

(52) U.S. Cl.
CPC .............. G01B 7/06 (2013.01); G01B 7/003 (2013.01); G01B 7/023 (2013.01); G01B 7/105 (2013.01);
(Continued)

(58) Field of Classification Search
CPC ......... H01L 2924/0002; H01L 2924/00; H01L 22/34; H01L 22/12; G01B 7/003; G01B 7/06; G01B 7/023; G01B 7/105
(Continued)

(56) References Cited

U.S. PATENT DOCUMENTS 5,760,589 A     6/1998  Katsuie
2001/0055836 A1* 12/2001 Kunda ................ B81C 1/00333
                                                      438/108

(Continued)

FOREIGN PATENT DOCUMENTS

CN     101754919 A    6/2010
CN     102857668 A    1/2013
(Continued)

OTHER PUBLICATIONS

CN 105136011 Machine Translation, Dec. 9, 2015 (Year: 2015).*
CN 205102770 Machine Translation, Mar. 23, 2016 (Year: 2016).*

Primary Examiner — Raul J Rios Russo
(74) Attorney, Agent, or Firm — Gang Yu

(57) ABSTRACT

Disclosed is a film thickness detection device, including a common unit (1) and a detection unit (2); the common unit (1) comprises at least one common electrode (11); the detection unit (2) comprises at least one sensor chip (21) and a signal processing unit (23); the sensor chips (21) are opposite to the common unit (1) in a first direction and are arranged at intervals; the spaces between the common unit (1) and the sensor chips (21) form a transport channel for a to-be-tested film; each of the sensor chips (21) comprises at least one row of multiple detection electrodes (211) arranged along a second direction; the second direction is perpendicular to a moving direction of the to-be-tested film; the first direction is perpendicular to a first plane; the first plane is parallel to the second direction; the sensor chips (21) are configured to induce electrical signals on the common
(Continued)

electrodes (11) and output the electrical signals; and the signal processing unit (23) is electrically connected with the sensor chips (21), processes the electrical signals output by the sensor chips (21) and outputs the electrical signals.

7 Claims, 5 Drawing Sheets

(51) Int. Cl.

| | | |
|---|---|---|
| *G01B 7/14* | (2006.01) | |
| *G01B 7/02* | (2006.01) | |
| *G01B 7/00* | (2006.01) | |
| *G01B 21/08* | (2006.01) | |
| *G07D 7/164* | (2016.01) | |
| *H01L 21/66* | (2006.01) | |

(52) U.S. Cl.
CPC ............... *G01B 7/14* (2013.01); *G01B 21/08* (2013.01); *G07D 7/164* (2013.01); *H01L 22/12* (2013.01); *H01L 22/34* (2013.01); *H01L 2924/00* (2013.01); *H01L 2924/0002* (2013.01)

(58) Field of Classification Search
USPC .......... 324/76.11–76.83, 439, 459, 522, 549, 324/609, 635, 644, 649, 662, 671, 691, 324/699, 713, 715, 716
See application file for complete search history.

(56) References Cited

U.S. PATENT DOCUMENTS

| | | | | |
|---|---|---|---|---|
| 2005/0178203 | A1* | 8/2005 | Goto | ................... B81C 1/00238 |
| | | | | 73/514.16 |
| 2008/0066546 | A1* | 3/2008 | Katsumata | ......... G01C 19/5719 |
| | | | | 73/504.12 |
| 2013/0070133 | A1* | 3/2013 | Takazawa | .............. H04N 5/379 |
| | | | | 348/294 |
| 2013/0250151 | A1* | 9/2013 | Kato | ................... H04N 5/3745 |
| | | | | 348/300 |
| 2016/0274181 | A1* | 9/2016 | Aoyama | ............ G01C 19/5649 |

FOREIGN PATENT DOCUMENTS

| | | |
|---|---|---|
| CN | 103363887 A | 10/2013 |
| CN | 105136011 A | 12/2015 |
| CN | 105333809 A | 2/2016 |
| CN | 205102770 U | 3/2016 |
| CN | 205788442 U | 12/2016 |
| EP | 1148315 A2 | 10/2001 |
| JP | S6076289 A | 5/1985 |
| JP | 2001240271 A | 9/2001 |
| JP | 2002206905 A | 7/2002 |

* cited by examiner

FILM THICKNESS DETECTION DEVICE

TECHNICAL FIELD

The present invention relates to the technical field of thickness detection, and more particularly, to a film thickness detection device.

BACKGROUND

The online continuous thickness measurement for a lamellar article such as a piece of paper, a note, a plastic to-be-tested film and a textile article becomes increasingly important in product production, detection, treatment and recycling, etc. At present, technologies for detecting a thickness of a to-be-tested film mainly include those using a Hall component, reflective ultrasonic detection, transmission ultrasonic detection, electromagnetic induction detection, eddy current detection and so on. However, the volume of detection devices corresponding to these technologies is large and the cost of detection devices corresponding to these technologies is high and thus are not beneficial to their applications hereto.

In recent years, a technology for detecting the thickness of the to-be-tested film via electrostatic induction between electrodes is under research and exploration continuously. For example, a Chinese Patent with the publication No. CN210302446Y discloses a capacitive paper thickness sensor, which is mainly to convert the change of a capacity of a capacitor into a change of an oscillation frequency and then convert the change of the frequency into a change of a voltage via a frequency-voltage conversion module. A Chinese Patent with the publication No. CN103363887A also discloses a material thickness detection method, which takes an electrode plate of a plate capacitor as a sensitive device for thickness detection and in which a displacement of a capacitive movable electrode plate caused by a thickness change of a measured object results in a capacity change of the plate capacitor.

With the above technology for detecting the thickness of the to-be-tested film via the electrostatic induction between the electrodes, the size of the detection device is reduced to a certain extent. However, the displacement of the capacitive plate still needs to be generated under the guidance of a mechanical device, which does not comply with the miniaturization development of the detection device. Moreover, the accuracy of the mechanical device determines the measurement accuracy to a large extent, particularly under conditions in which an article is under a high-speed transmission state, needs multipoint multi-channel accurate measurement and a measured object is extremely thin. The measurement accuracy of the above thickness sensor is relatively low. Besides, the mechanical device will generate a huge noise during high-speed working, which is not meet the development requirements of a modern industry on environmental protection and low carbon.

SUMMARY

The main objective of the invention is to provide a film thickness detection device, so as to solve a problem of relatively low detection accuracy of the film thickness detection device in conventional art.

In order to achieve the above objective, according to one aspect of the present invention, a film thickness detection device is provided, which comprises a common unit and a detection unit; the common unit comprises at least one common electrode; the detection unit comprises at least one sensor chip and a signal processing unit; the each sensor chip is opposite to the common unit in a first direction, intervals spaced between the common unit and the each sensor chip form a transport channel for a to-be-tested film; the each sensor chip comprises at least one row of detection electrodes arranged along a second direction; the second direction is perpendicular to a moving direction of the to-be-tested film; the first direction is perpendicular to a first plane; the first plane is parallel to the second direction; the each sensor chip is configured to sense a electrical signal on the common electrode and output the sensed electrical signal; and the signal processing unit is electrically connected with the sensor chip, configured to process the electrical signal output by the sensor chip and output the processed electrical signal.

Further, the sensor chips further comprises a control electrode; and the control electrode is configured to input control signals for controlling the work of the sensor chip and outputting electrical signals detected by the sensor chip.

Further, the detection unit comprises multiple sensor chips arranged at intervals along the second direction.

Further, the signal processing unit comprises: a signal processing circuit, electrically connected with the sensor chip; and a signal interface, electrically connected with the signal processing circuit and configured to input the control signal and outputting electrical signals processed by the signal processing circuit.

Further, the signal processing circuit comprises: an amplification circuit, an end of the amplification circuit is electrically connected with the sensor chip and is configured to amplify the electrical signals output by the each sensor chip; an analog-digital conversion circuit, one end of the analog-digital conversion circuit is electrically connected with the other end of the amplification circuit and is configured to convert the electrical signals amplified by the amplification circuit into a digital signal; a first correction circuit, comprising an input end that is electrically connected with the other end of the analog-digital conversion circuit, and the first correction circuit is configured to correct the digital signal and output the corrected digital signal; and a control circuit, one end of the control circuit is electrically connected with a signal control end of the amplification circuit, a signal control end of the analog-digital conversion circuit and a signal control end of the first correction circuit and the other end of the control circuit electrically connected with the signal interface.

Further, the first correction circuit comprises a first output end and a second output end; the signal processing circuit further comprises: a register, one end of the register is electrically connected with the first output end, and the register is configured to store the digital signal output by the first correction circuit and output a delayed digital signal; and a delay differential amplification circuit, comprising a first input end, a second input end and a signal control end, the first input end is electrically connected with the other end of the register, the second input end is electrically connected with the second output end, the signal control end is electrically connected with the control circuit, and the delay differential amplification circuit is configured to amplify a difference value between corrected digital signal and the delayed digital signals and output the amplified difference value.

Further, the register is a shift register; the number of the digital signals registered in the shift register is not equal to a value which is integer multiple of the total number of the detection electrodes arranged by the detection unit along the second direction; and the number of the digital signals registered in the shift register is greater than the total number of the detection electrodes arranged by the detection unit along the second direction.

Further, the signal processing circuit further comprises: a second correction circuit, one end of the second correction circuit is electrically connected with an output end of the delay differential amplification circuit and the other end is electrically connected with the signal interface.

Further, the common unit further comprises: a signal input part, is configured to input an electrical signal of a power to the common electrode.

Further, the common unit further comprises a first substrate; the common electrode is provided on a first surface of the first substrate; the detection unit comprises a second substrate; the second substrate and the common unit are arranged at intervals on the first direction; the first surface of the first substrate is toward a first surface of the second substrate; the each sensor chip is provided on the first surface of the second substrate; the signal processing unit is provided on a second surface of the second substrate; and the first surface of the first substrate and the first surface of the second substrate are both parallel to the first plane.

Further, the film thickness detection device further comprises: a first frame body, provided with a first accommodation space, the first frame body covers on the first substrate and the common unit is positioned in the first accommodation space; a first protective substrate, connecting with the first frame body and is configured to protect the common electrode; a second frame body, provided with a second accommodation space, the second frame body covers on the second substrate and the detection unit is positioned in the second accommodation space; and a second protective substrate, is connected with the second frame body and is configured to protecting the each detection electrode.

By applying the technical solutions of the invention, the detection device comprises at least one sensor chip and each of the chips comprises multiple detection electrodes arranged at intervals along a second direction; the density of the detection electrodes determines a resolution of a detection signal and thus determines the detection accuracy; during actual detection, according to a demand, the number of the detection electrodes on the sensor chip may be adjusted or the number of the sensor chips may be adjusted; in this way, the accuracy of the film thickness detection device can be flexibly adjusted and the detection device can obtain higher detection accuracy.

BRIEF DESCRIPTION OF THE DRAWINGS

The accompanying drawings are described here to provide further understanding of the present invention, and form a part of the present invention. The schematic embodiments and description of the present invention are adopted to explain the present invention, and do not form improper limits to the present invention. In the drawings.

NUMERALS IN THE DRAWINGS

1—common unit; 2—detection unit; 11—common electrode; 21—sensor chip; 10—first substrate; 12—first protective substrate; 13—signal input part; 14—first frame body; 20—second substrate; 22—second protective substrate; 23—signal processing unit; 24—second frame body; 100—to-be-tested film; 101—first foreign matter; 102—second foreign mater; 211—detection electrode; 212—control electrode 231—signal processing circuit; 232—signal interface; 01—amplification circuit; 02—analog-digital conversion circuit; 03—first correction circuit; 04—register; 05—delay differential amplification circuit; 06—second correction circuit; 07—control circuit.

DETAILED DESCRIPTION OF THE EMBODIMENTS

It is to be noted that, the detailed description is exemplary and is intended to further describe the present invention. Unless defined, otherwise all the technical and scientific terms used herein have the same meanings as those generally understood by the skilled in the art to which the present invention pertains.

It is to be noted that, the terms used herein are merely to describe the specific embodiments and are not intended to limit the exemplary embodiments of the present invention. As used herein, unless specified explicitly by a context, otherwise a singular form also means a plural form. In addition, it further should be understood that, when the terms "include" and/or "comprise" are used in the specification, it is indicated that there have characteristics, steps, operations, device, components and/or their combinations.

As described in the background, the detection accuracy of the film thickness detection device in the prior art is relatively low. In order to solve the above technical problems, a film thickness detection device is provided.

Figure 1:
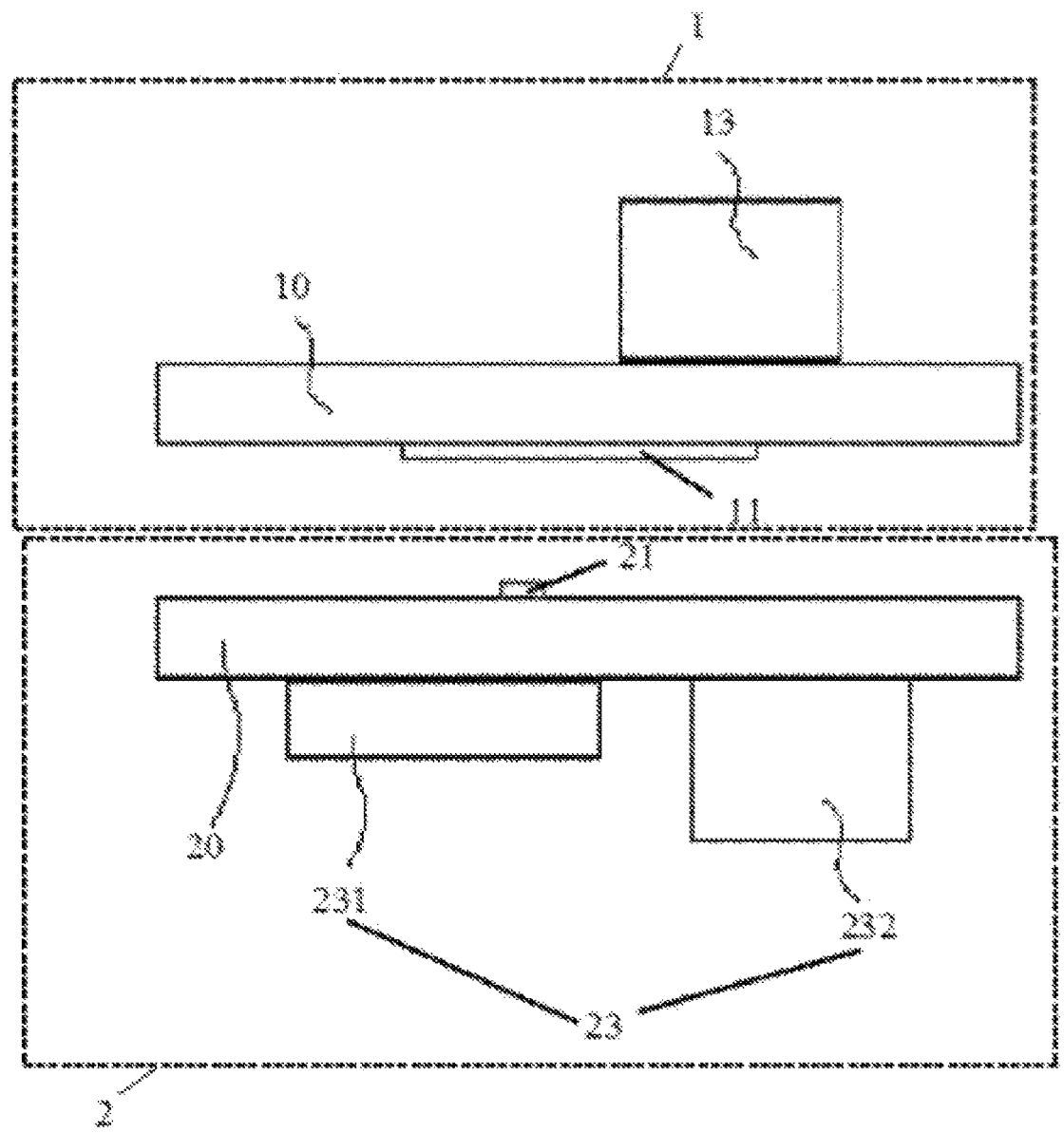
FIG. 1 illustrates a structural diagram of a detection device provided according to an embodiment of the present invention.
Figure 2:
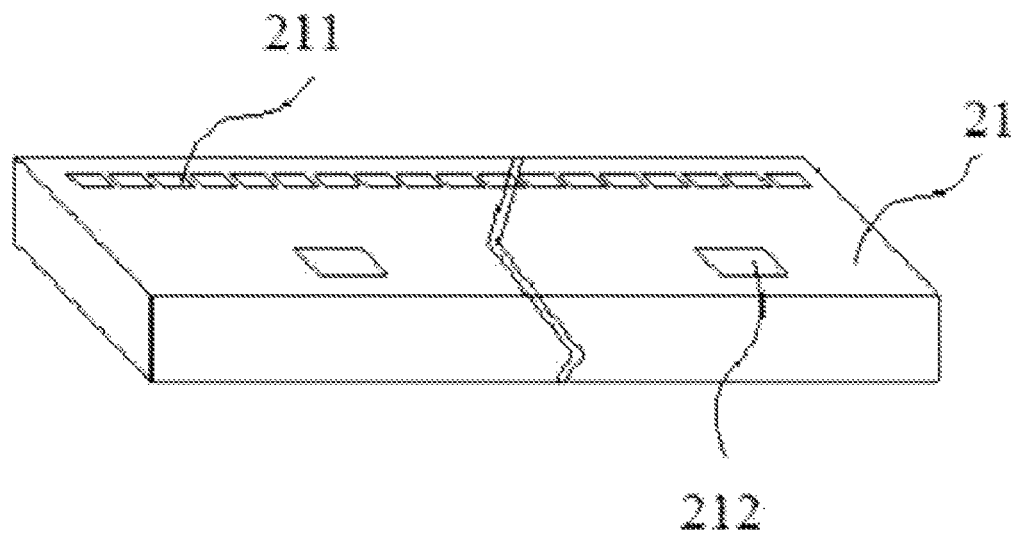
FIG. 2 illustrates a structural diagram of a sensor chip provided by an embodiment.

In one typical embodiment, a film thickness detection device is provided. As shown in FIG. 1, the device comprises a common unit 1 and a detection unit 2; the common unit 1 comprises at least one common electrode 11; the detection unit 2 comprises at least one sensor chip 21 and a signal processing unit 23; the sensor chip 21 is opposite to the common unit 1 in a first direction, intervals spaced between the common unit 1 and the each sensor chip 21 form a transport channel for a to-be-tested film; as shown in FIG. 2, each of the sensor chip 21 comprises at least one row of detection electrodes 211 arranged along a second direction; the second direction is perpendicular to a moving direction of the to-be-tested film; the first direction is perpendicular to a first plane; the first plane is parallel to the second direction; the sensor chip 21 is configured to sense a electrical signal on the common electrodes 11 and then output the sensed electrical signal; and the signal processing unit 23 is electrically connected to the sensor chip 21, and is configured to process electrical signal output by the sensor chip 21 and then output the processed electrical signal.

It is to be noted that, unless specified, otherwise "arranged along the second direction" in the present invention indicates "arranged linearly along the second direction".

In the detection device, the common electrode and each of detection electrodes are formed into a plate capacitor similar structure, and there is no fixed medium filled therebetween but a transport channel is formed. After the common electrode is charged, the detection electrode can induce the charges. The number of charges induced by the detection electrode is determined by an area of two opposite electrodes, a distance between the two electrodes, an electric charge quantity carried on the common electrode and a dielectric constant between the two electrodes. Under a condition in which the structure is determined, the charges induced by the detection electrode only are relevant to the dielectric constant between the two electrodes. When the to-be-tested film passes through the transport channel, the dielectric constant of a medium between the two electrodes is changed and the number of the charges induced by the detection electrode is also changed. In a case where the thickness of the to-be-tested film is different, the dielectric constant between the two electrodes is also different, so are the charges induced by the detection electrode. Therefore, by detecting the number of electrical signals induced by the detection electrode plate, the thickness of the to-be-tested film can be calculated.

The device comprises at least one sensor chip, and each of the chips comprises multiple detection electrodes arranged at intervals along a second direction. The density of the detection electrodes determines a resolution of a detection signal and thus determines the detection accuracy. During actual detection, according to a demand, the number of the detection electrodes on the sensor chip may be adjusted or the number of the sensor chips may be adjusted. In this way, the accuracy of the film thickness detection device can be flexibly adjusted and the detection accuracy of the detection device is higher.

In one embodiment of the present invention, the resolution corresponding to the detection electrodes is 100 DPI. That is, a transverse arrangement period of the detection electrodes (namely, a central distance between adjacent two detection electrodes on the second direction) is 0.254 mm. The sensor chip is integrated circuit manufactured in a Complementary Metal-Oxide-Semiconductor Transistor (CMOS) technology and is 18.3 mm long (size on the second direction). 72 detection electrodes can be provided on one chip and each chip is 0.3 mm wide (namely, size on a direction perpendicular to the second direction). The number of the arranged chips determines a detection range of the entire sensor. For example, when a banknote is detected, 10 or 11 sensor chips generally may form a 183 mm or 201 mm detection range.

In the present invention, the common unit may comprise one common electrode and may also comprise multiple common electrodes. A skilled in the art may provide the number of the common electrodes according to an actual condition. When the common unit only comprises one common electrode, the common electrode is a plane electrode with a relatively large area and is configured to form a pair of electrostatic induction electrodes with the opposite detection electrode, its area at least covers all detection electrodes of the detection unit.

In one embodiment of the present invention, as shown in FIG. 2, each of the sensor chips 21 further comprises a control electrode 212. The control electrode 212 is configured to input control signals for controlling the work of the above sensor chip 21 and output the electrical signal detected by the each sensor chip 21.

Figure 3:
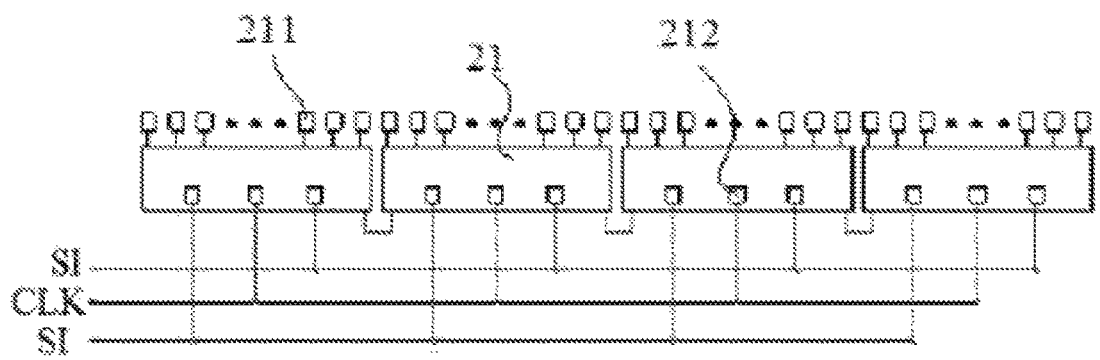
FIG. 3 is an electrical schematic diagram of a sensor chip provided by an embodiment.

In one specific embodiment of the present invention, an electrical schematic diagram for arrangement of the sensor chips in the detection device is as shown in FIG. 3. The detection unit comprises multiple sensor chips 21 arranged at intervals along a second direction. Each sensor chip 21 comprises one control electrode 212. The detection electrode 211 on each sensor chip 21 is also arranged into a straight line at intervals along the second direction. The control signals of the sensor chip comprises a clock signal CLK and a line scanning control signal SI, etc., all of which are input by the control electrode 212. An SIG is output signal of the chip. The each of the sensor chips in the detection device further comprises a shift register and multiple switch circuits, where each switch is electrically connected with one detection electrode. The detection electrodes are controlled by the switches to be turned on and turned off. When the shift register receives a start signal, it controls the turn-on and turn-off of the switch and thus the detection electrode is controlled to be turned on and turned off.

Figure 4:
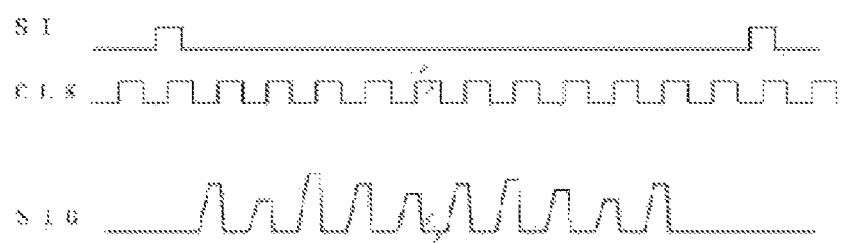
FIG. 4 is a working time sequence diagram of a sensor chip in FIG. 3.

A working time sequence diagram for the sensor chip in the detection device is as shown in FIG. 4. Under the action of the clock signal CLK, when the sensor chip receive a line start signal, the shift register and the switch circuit of the sensor chip switch on the detection electrodes in sequence one by one, so that induction electrical signals on the detection electrode are output via the control electrodes successively.

Figure 5:
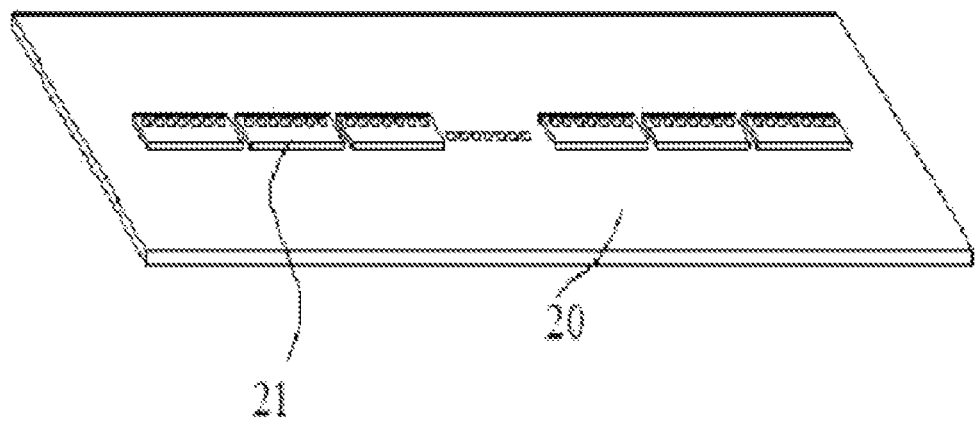
FIG. 5 is a local structural diagram of a detection unit provided by an embodiment.

In order that the detection accuracy of the detection device can be adjusted more flexibly, as shown in FIG. 5, the detection unit preferably comprises multiple sensor chips 21 arranged at intervals along the second direction.

In one embodiment of the present invention, the signal processing unit 23 comprises a signal processing circuit 231 and a signal interface 232, where the signal processing circuit 231 is electrically connected with the each of the sensor chips 21; and the signal interface 232 is electrically connected with the signal processing circuit 231 and is configured to input the control signals and output electrical signals processed by the signal processing circuit 231.

Figure 6:
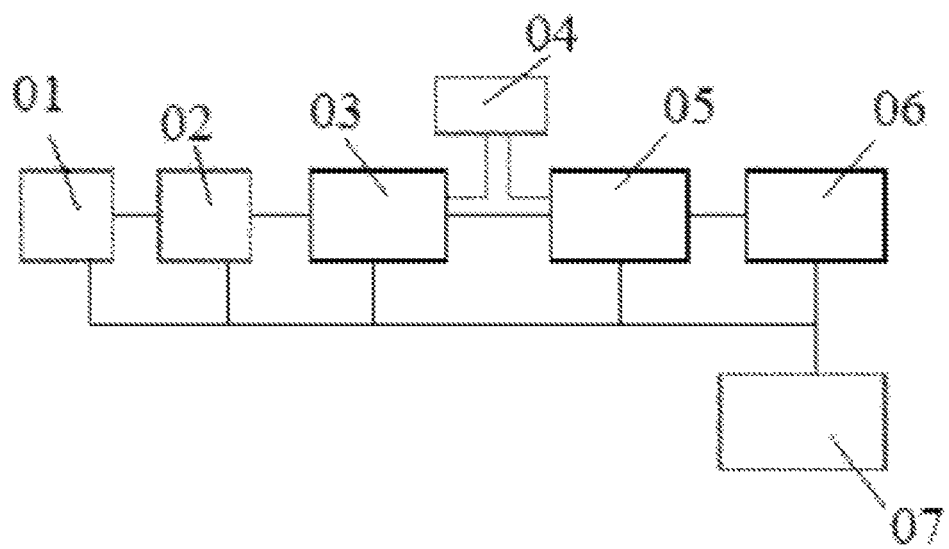
FIG. 6 is a structural diagram of a signal processing circuit provided by an embodiment.

In one embodiment of the present invention, as shown in FIG. 6, the signal processing circuit comprises an amplification circuit 01, an analog-digital conversion circuit 02, a first correction circuit 03 and a control circuit 07.

Herein, one end of the amplification circuit is electrically connected with the each of the sensor chips. Generally, the electrical signals output by the sensor chips are relatively low and are only at a millivolt, so it is necessary to employ the amplification circuit to amplify them. The multistage amplification may also be performed in terms of the amplitudes of the signals, thus meeting the requirement on conversion of the analog-digital conversion circuit. The amplification circuit in the present invention may be any circuit capable of implementing amplification in the prior art.

A digital signal output by the amplification circuit is input to the analog-digital conversion circuit. The analog-digital conversion circuit is configured to convert an electrical signal amplified by the amplification circuit into the digital signal and input the digital signal to the first correction circuit.

The first correction circuit is configured to correct and output the digital signal. Signals detected by the detection electrode are generally low and thus need to be amplified. However, upon the amplification of the signals, the carried noise signals are also amplified. The correction circuit is mainly used to eliminate the error caused by the sensor chip it itself to obtain effective amplified signals. The first correction circuit generally comprises a register (not shown in figure). A noise signal collected under a static state is stored in the register to take as a correction factor; and a correction method of subtracting the noise signal from a real-time signal in the prior art may be adopted, which will not be repeated here.

One end of the control circuit is electrically connected with a signal control end of the amplification circuit, a signal control end of the analog-digital conversion circuit and a signal control end of the first correction circuit, and the other end of the control circuit is electrically connected with the signal interface.

In order that the detection accuracy of the film thickness detection device of the present invention is further improved, as shown in FIG. 6, the first correction circuit 03 preferably comprises a first output end and a second output end. The signal processing circuit in the present invention further comprises a register 04 and a delay differential amplification circuit 05.

Herein, one end of the register is electrically connected with the first output end. The register is configured to store the digital signal output by the first correction circuit and output a delayed digital signal. The delay differential amplification circuit comprises a first input end, a second input end and a signal control end. The first input end is electrically connected with the other end of the register, the second input end is electrically connected with the second output end, and the signal control end is electrically connected with the control circuit. The delay differential amplification circuit is configured to amplify a difference value between the corrected digital signal and the delayed digital signal and output the difference value. That is, the digital signal corrected by the first correction circuit is divided into two paths to output, in which one path is sent to the delay differential amplification circuit for differential amplification on the digital signal and the other path is delivered to the register for delayed caching.

In the present invention, the register is a shift register. The register is configured to temporarily store the corrected digital signal, so that a delayed time difference between the digital signal and the digital signal directly output after correction is generated and the subsequent delay differential signal amplification circuit may perform differential amplification on digital signals detected by different detection electrodes and different scanning lines. In this way, only by arranging multiple detection electrodes along the second direction and taking scanning data on different lines, the thickness and thickness gradient (namely, thickness difference) of a to-be-tested object on the second direction and on a medium moving direction may be measured. However, the detection device in the prior art at least needs to provide at least two rows of detection electrodes on the moving direction of the to-be-tested film; and by performing differential amplification on digital signals obtained by two opposite detection electrodes in the two rows of the detection electrodes, the thickness gradient of the to-be-tested film on a direction parallel to its moving direction is obtained.

In one embodiment of the present invention, the shift register at least may store more than one line of scanning data. The film thickness detection device is composed of 10 sensor chips and each of the sensor chips is provided with 72 detection electrodes. The shift register may be is configured to store 1445 signal data, i.e. to store digital signals of two rows of and five detection electrodes. Whenever a next digital signal enters, the data in the shift register are moved one bit forward in sequence to output to the first input end of the delay differential amplification circuit. For example, after the first correction circuit outputs scanned data of an $N^{th}$ detection electrode in a certain line (supposing an $M^{th}$ line) of sensors, the second output end of the delay differential amplification circuit receives the data of the $N^{th}$ detection electrode in the $M^{th}$ line and the first output end receives data of an $(N+5)^{th}$ detection electrode in an $(M+2)^{th}$ line. In other words, the delay differential amplification circuit performs the differential amplification on the $(N+5)^{th}$ digital signal in the $(M+2)^{th}$ line and the $N^{th}$ digital signal in the $M^{th}$ line.

The number of digital signals registered in the shift register is not limited to the above 1445. That is, the number of lines delayed on the moving direction of the to-be-tested film and the number of digital signals delayed on the second direction are not limited to this, and may be changed according to different scanning speeds or structure conditions of the detection electrodes.

In one preferred embodiment of the present invention, the number of the digital signals registered in the shift register is not equal to an integer multiple of the total number of the detection electrodes on the second direction in the detection unit, and is greater than the total number of the detection electrodes on the second direction in the detection unit. That is, detection points corresponding to digital signals input to the two input ends of the delayed differential amplification circuit are on different lines and are on different columns. In this way, the differential amplification may be performed on the digital signals not on the same line and the same column, and thus foreign matters on the to-be-tested film along various directions can be detected and the detection device is prevented from failing to detect foreign matters parallel to the second direction on the to-be-tested film (such as a second foreign matter 102 shown in FIG. 9) and foreign matters on a direction parallel to the moving direction of the to-be-tested film (such as a first foreign matter 101 shown in FIG. 8).

Figure 8:
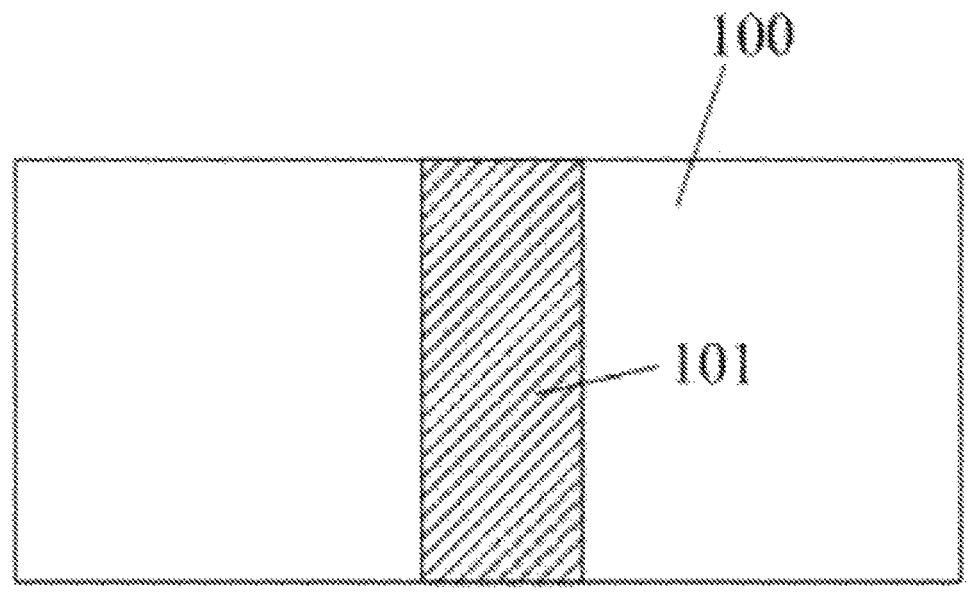
FIG. 8 is a top view of a to-be-tested film in an embodiment.

As shown in FIG. 8, when the to-be-tested film 100 has the first foreign matter 101 on the direction parallel to its moving direction, in a case where the number of the signals registered in the shift register is equal to the integer multiple of the total number of the detection electrodes on the second direction in the detection unit, signals input to the two input ends of the delay differential amplification circuit are detection signals corresponding to detection points on a same column and are both the same; the signals output by the delay differential amplification circuit are 0; in other words, there is no thickness gradient (namely, thickness difference) therebetween and the detection device cannot detect the first foreign matter 101 on the to-be-detected film 100.

Figure 9:
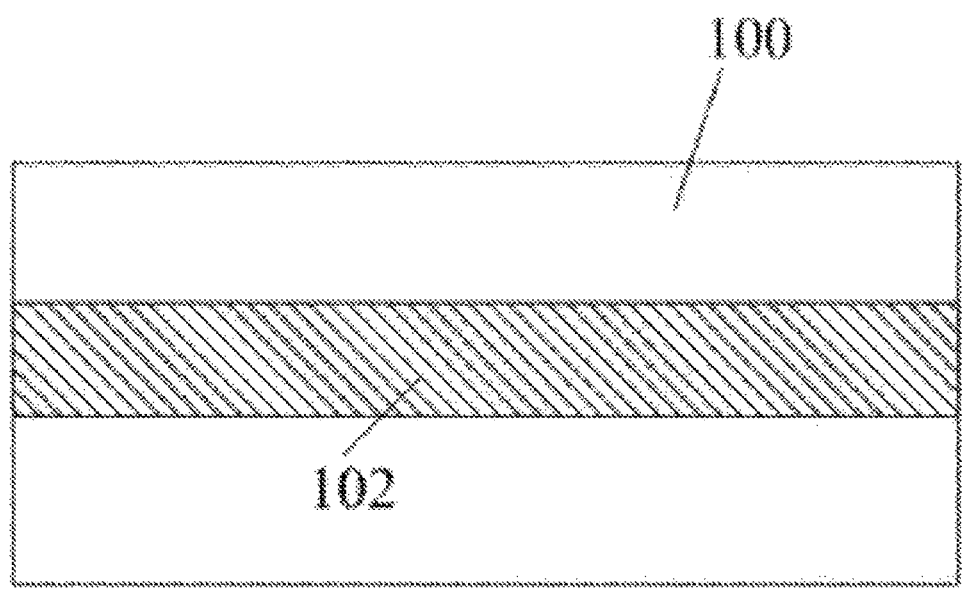
FIG. 9 is a top view of a to-be-tested film in another embodiment.

As shown in FIG. 9, when the second foreign matter 102 on the direction parallel to its moving direction is provided on the to-be-tested film 100, in a case where the number of the signals registered in the shift register is smaller than the total number of the detection electrodes on the second direction in the detection unit, signals input to the two input ends of the delay differential amplification circuit are detection signals corresponding to detection points on a same line and are both the same; the signals output by the delay differential amplification circuit are 0; in other words, there is no thickness gradient (namely, thickness difference) therebetween and the detection device cannot detect the first foreign matter 102 on the to-be-detected film 100.

Since the digital signals processed by the delay differential amplification circuit are amplified digitally, internal noises remained in previous digital signals are also amplified, which will have an impact on the detection accuracy. As shown in FIG. 6, preferably, a second correction circuit 06 is further arranged behind the output end of the delay differential amplification circuit 05 so as to perform more accurate correction on digitally amplified signals and obtain accurate detection signals. An output end of this correction circuit is electrically connected with the signal interface. The correction principle of the second correction circuit is the same as that of the first correction circuit and the only difference lies in a correction coefficient. The correction coefficient of the second correction circuit is a correction coefficient that is a noise signal collected under the static state at a backward stage of the delay differential amplification circuit.

In order to apply a voltage to the common electrodes more conveniently, as shown in FIG. 1, the common unit preferably comprises a signal input part 13. The signal input part is configured to input an electrical signal of a power to the common electrodes 11.

In another embodiment of the present invention, as shown in FIG. 1, the common unit 1 further comprises a first substrate 10; the common electrode 11 is provided on a first surface of the first substrate 10; the detection unit 2 comprises a second substrate 20; the second substrate and the common unit 1 are arranged at intervals on the first direction; the first surface of the first substrate 10 is toward a first surface of the second substrate 20; as shown in FIG. 5, the sensor chip 21 is provided on the first surface of the second substrate 20; the signal processing unit 23 is provided on a second surface of the second substrate 20; and the first surface of the first substrate 10 and the first surface of the second substrate 20 are both parallel to the first plane. As shown in FIG. 1, the signal input part 13 is provided on the second surface, opposite to the first surface, of the first substrate 10.

The first substrate is a carrier for other structures of the common unit, the second substrate is a carrier for other structures of the detection unit, and the first substrate and the second substrate are placed oppositely to form the transport channel conveniently. In order to transport each to-be-tested film between two electrode plates smoothly, according to different sizes of the to-be-tested films, the distance between the two electrode plates may be 1-10 mm. However, the distance therebetween is not limited to this range, and the skilled in the art may set the distance therebetween within an appropriate range according to a specific condition.

The first substrate and the second substrate may be respectively and independently selected from a glass substrate, a Printed Circuit Board (PCB) substrate, a metal plate substrate or a ceramic substrate. The two substrates may be made of a same material or different materials.

In one embodiment of the present invention, the first substrate is the PCB substrate on which a required pattern is designed and the common electrodes are provided. An electrical signal is input to the common electrode via the power so that the common electrode carry charges. Moreover, in this embodiment, the second substrate is also the PCB substrate.

Figure 7:
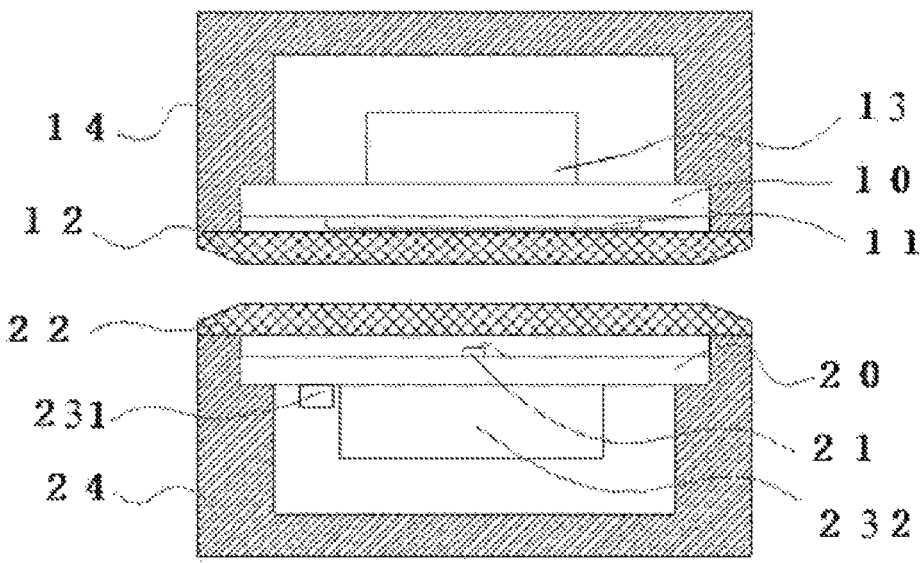
FIG. 7 is a structural diagram of a detection device provided by an embodiment.

In order to protect the common unit and the detection unit, as shown in FIG. 7, the film thickness detection device further comprises a first frame body 14, a first protective substrate 12, a second frame body 24 and a second protective substrate 22, wherein the first frame body 14 is provided with a first accommodation space; the first frame body 14 covers on the first substrate 10 and the common unit 1 is positioned in the first accommodation space; the first protective substrate 12 is connected with the first frame body 14 and is configured to protect the common electrode; the second frame body 24 is provided with a second accommodation space; the second frame body 24 covers on the second substrate 20 and the detection unit 2 is positioned in the second accommodation space; and the second protective substrate 22 is connected with the second frame body 24 and is configured to protect each of the detection electrodes.

The first frame body and the second frame body may be made of a plastic frame and manufactured via an injection molding technology. The first protective substrate and the second protective substrate may be made of a glass plate, may also be ceramic substrates and may further be made of a same material or different materials.

From the above, it may be observed that the embodiments of the present invention achieve the following technical effects.

The device comprises at least one sensor chip and each of the chips comprises multiple detection electrodes arranged at intervals along a second direction; the density of the detection electrodes determines a resolution of a detection signal and thus determines the detection accuracy; during actual detection, according to a demand, the number of the detection electrodes on the sensor chip may be adjusted and thus the density of the detection electrodes is adjusted; or the number of the sensor chips may be adjusted; in this way, the accuracy of the film thickness detection device can be flexibly adjusted and the detection device can obtain higher detection accuracy.

The above is only the preferred embodiment of the present invention and not intended to limit the present invention. To the skilled in the art, the present invention may have various modifications and changes. Any modifications, equivalent replacements, improvements and the like made within the spirit and principle of the present invention shall fall within the scope of protection of the present invention.

What is claimed is:

1. A film thickness detection device, comprising a common unit and a detection unit, the common unit comprising at least one common electrode, wherein the detection unit comprises:
    at least one sensor chip, each sensor chip being opposite to the common unit in a first direction, intervals spaced between the common unit and the each sensor chip forming a transport channel for a to-be-tested film, the each sensor chip comprises at least one row of detection electrodes arranged along a second direction, the second direction being perpendicular to a moving direction of the to-be-tested film, the first direction being perpendicular to a first plane, the first plane being parallel to the second direction, and the each sensor chip being configured to sense a electrical signal on the common electrode and output the sensed electrical signal; and
    a signal processing unit, electrically connected with the sensor chip, configured to process the electrical signal output by the sensor chip and output the processed electrical signal,
    wherein the signal processing unit comprises:
    a signal processing circuit, electrically connected with the sensor chip; and
    a signal interface, electrically connected with the signal processing circuit and configured to input a control signal and output the electrical signal processed by the signal processing circuit,
    wherein the signal processing circuit comprises:
    an amplification circuit, an end of the amplification circuit being electrically connected with the each sensor chip the amplification circuit being configured to amplify the electrical signals output by the each sensor chip;

an analog-digital conversion circuit, one end of the analog-digital conversion circuit being electrically connected with the other end of the amplification circuit, the analog-digital conversion circuit being configured to convert the electrical signals amplified by the amplification circuit into a digital signal;

a first correction circuit, comprising an input end, the input end being electrically connected with the other end of the analog-digital conversion circuit, the first correction circuit being configured to correct the digital signal and output the corrected digital signal; and a control circuit, one end of the control circuit being electrically connected with a signal control end of the amplification circuit, a signal control end of the analog-digital conversion circuit and a signal control end of the first correction circuit, the other end of the control circuit being electrically connected with the signal interface, wherein the first correction circuit comprises a first output end and a second output end; the signal processing circuit further comprises:

a register, one end of the register being electrically connected with the first output end, and the register being configured to store the digital signal output by the first correction circuit and output a delayed digital signal; and a delay differential amplification circuit, comprising a first input end, a second input end and a signal control end, the first input end electrically connecting with the other end of the register, the second input end electrically connecting with the second output end, the signal control end electrically connecting with the control circuit, and the delay differential amplification circuit being configured to amplify a difference value between corrected the digital signal and the delayed digital signal and output the amplified difference value, wherein the signal processing circuit further comprises:

a second correction circuit, one end of the second correction circuit being electrically connected with an output end of the delay differential amplification circuit and the other end of the second correction circuit electrically connecting with the signal interface.

2. The film thickness detection device as claimed in claim 1, wherein the sensor chip further comprises a control electrode, the control electrode being configured to input a control signal for controlling a work of the each sensor chip and output the electrical signal detected by the each sensor chip.

3. The film thickness detection device as claimed in claim 1, wherein the detection unit comprises multiple sensor chips arranged at intervals along the second direction.

4. The film thickness detection device as claimed in claim 1, wherein the register is a shift register; the number of the digital signals registered in the shift register is not equal to a value which is integer multiple of the total number of the detection electrodes arranged by the detection unit along the second direction; and the number of the digital signals registered in the shift register is greater than the total number of the detection electrodes arranged by the detection unit along the second direction.

5. The film thickness detection device as claimed in claim 1, wherein the common unit further comprises:

a signal input part, being used for inputting an electrical signal of a power to the common electrode.

6. The film thickness detection device as claimed in claim 5, wherein the common unit further comprises:

a first substrate; the common electrode being provided on a first surface of the first substrate; and the detection unit comprises:

a second substrate, the second substrate and the common unit being arranged at intervals on the first direction; the first surface of the first substrate being toward a first surface of the second substrate; the each sensor chip being provided on the first surface of the second substrate; the signal processing unit being provided on a second surface of the second substrate; and the first surface of the first substrate and the first surface of the second substrate are both parallel to the first plane.

7. The film thickness detection device as claimed in claim 6, wherein the film thickness detection device further comprises:

a first frame body, provided with a first accommodation space, the first frame body covering on the first substrate and the common unit being positioned in the first accommodation space;

a first protective substrate, connecting with the first frame body and being configured to protect the each common electrode;

a second frame body, provided with a second accommodation space, the second frame body covering on the second substrate and the detection unit being positioned in the second accommodation space; and a second protective substrate, connecting with the second frame body and being configured to protect the each detection electrode.

\* \* \* \* \*

UNITED STATES PATENT AND TRADEMARK OFFICE
CERTIFICATE OF CORRECTION

PATENT NO. : 10,746,524 B2  
APPLICATION NO. : 16/099443  
DATED : August 18, 2020  
INVENTOR(S) : Wuchang Qi Page 1 of 1

It is certified that error appears in the above-identified patent and that said Letters Patent is hereby corrected as shown below:

On the Title Page

Item (73) Assignee: change "WEIHAI HAULING OPTO-ELECTRONICS CO., LTD." to "WEIHAI HUALING OPTO-ELECTRONICS CO., LTD."

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*